United States Patent
Fujiwara et al.

(10) Patent No.: US 12,531,549 B2
(45) Date of Patent: Jan. 20, 2026

(54) LATCH CIRCUITS AND METHODS FOR OPERATING THE SAME

(71) Applicant: Taiwan Semiconductor Manufacturing Company, Ltd., Hsinchu (TW)

(72) Inventors: Hidehiro Fujiwara, Hsinchu (TW); Yu Jung Li, Hsinchu (TW); Yueh Chiang, Hsinchu (TW); Wei-Chang Zhao, Hsinchu (TW); Yi-Hsin Nien, Hsinchu (TW); Kinshuk Khare, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 315 days.

(21) Appl. No.: 18/480,751

(22) Filed: Oct. 4, 2023

(65) Prior Publication Data
US 2024/0429902 A1    Dec. 26, 2024

Related U.S. Application Data

(60) Provisional application No. 63/510,030, filed on Jun. 23, 2023.

(51) Int. Cl.
*H03K 3/037* (2006.01)
*H03K 3/356* (2006.01)

(52) U.S. Cl.
CPC ..... *H03K 3/0375* (2013.01); *H03K 3/356156* (2013.01); *H03K 3/356191* (2013.01)

(58) Field of Classification Search
CPC ........... H03K 3/0375; H03K 3/356156; H03K 3/356191
See application file for complete search history.

(56) References Cited

U.S. PATENT DOCUMENTS

2007/0229132 A1    10/2007 Chu et al.
2009/0219752 A1*    9/2009 Wissel ................. H03K 3/0375
                                                              326/9

(Continued)

FOREIGN PATENT DOCUMENTS

TW         I783653 B        11/2022

OTHER PUBLICATIONS

Office Action issued in connection with Taiwan Appl. No. 113101347 dated Nov. 25, 2024.

(Continued)

*Primary Examiner* — Patrick O Neill
(74) *Attorney, Agent, or Firm* — FOLEY & LARDNER LLP

(57) ABSTRACT

A circuit includes a first Dual Interlocked Storage Cell (DICE) component, a second DICE component, a third DICE component, and a fourth DICE component operatively coupled to one another as a loop. The first and second DICE components form a first sub-latch configured to receive an input signal, the third and fourth DICE components form a second sub-latch configured to receive the same input signal, the first sub-latch is configured to provide, at a first node, an intermediate signal based on the input signal, and the second sub-latch is configured to provide, at a second node, the same intermediate signal based on the input signal. The circuit includes a first inverter configured to logically invert the intermediate signal and provide, at a third node, an output signal. The circuit includes a second inverter configured to logically invert the intermediate signal and provide, at the third node, the output signal.

20 Claims, 11 Drawing Sheets

(56) References Cited

U.S. PATENT DOCUMENTS

| | | |
|---|---|---|
| 2013/0166990 A1 | 6/2013 | Morris et al. |
| 2021/0194470 A1* | 6/2021 | Maru ............... H03K 3/356078 |
| 2022/0209752 A1* | 6/2022 | Nakanishi ............ H03K 3/0375 |

OTHER PUBLICATIONS

Office Action issued in Korean Appl. No. 10-2024-0078275 dated Oct. 22, 2025.

* cited by examiner

LATCH CIRCUITS AND METHODS FOR OPERATING THE SAME

CROSS-REFERENCE TO RELATED APPLICATION

This application claims priority to and the benefit of U.S. Provisional Application No. 63/510,030, filed Jun. 23, 2023, entitled "VARIATION AND TRANSIENT FAULT TOLERANT DICE LATCH," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
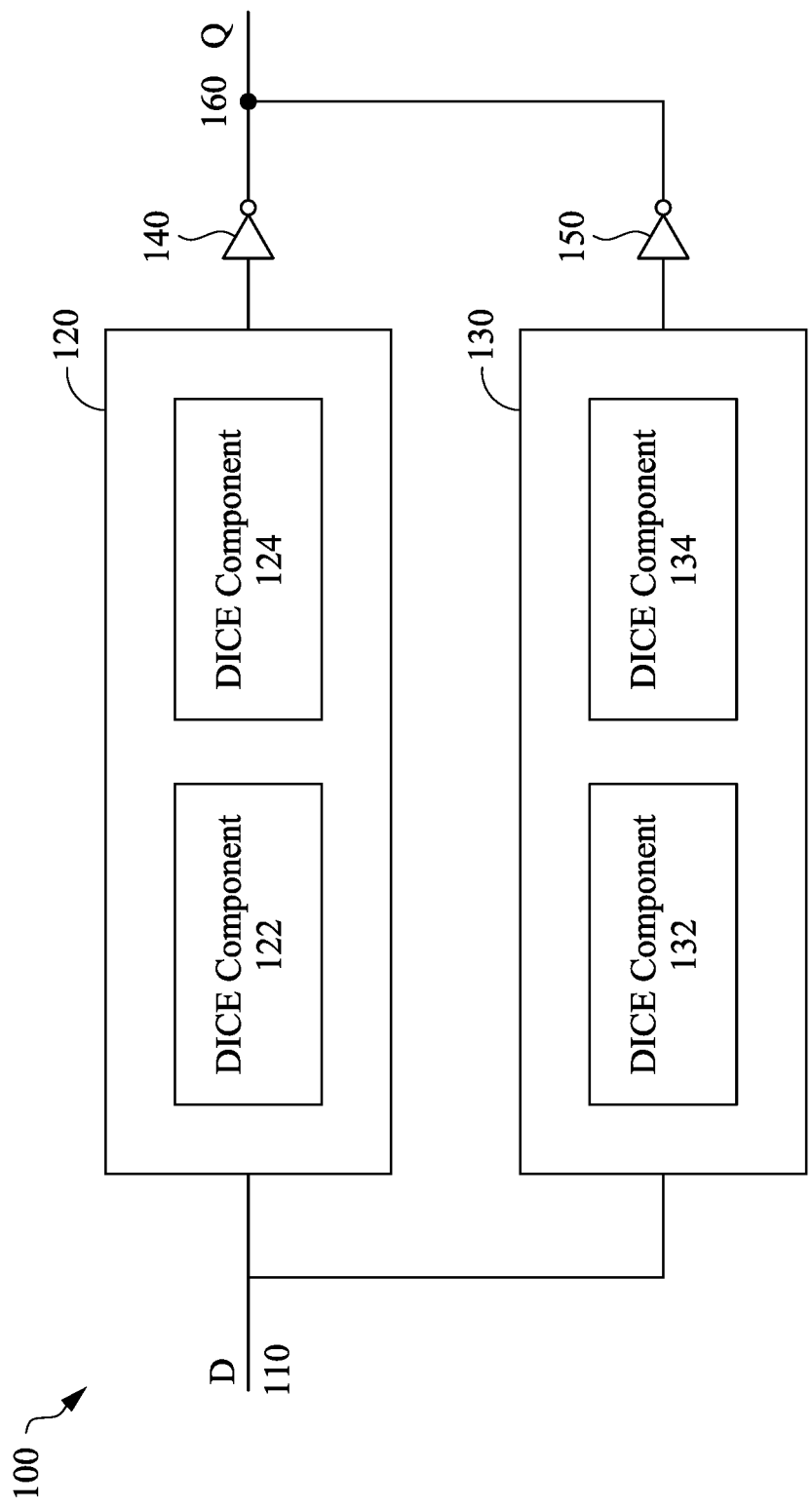
FIG. 1 illustrates a block diagram of an example DICE latch circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits often include volatile storage elements. Typical volatile storage elements may be based on cross-coupled inverters (latches). A volatile storage element retains data only so long as the integrated circuit is powered. In the event of power loss, the data in the volatile storage element is lost. Although nonvolatile storage elements such as memory elements based on electrically-erasable programmable read-only memory technology are not subject to data loss in this way, it is often not desirable or possible to fabricate nonvolatile storage elements as part of an integrated circuit. As a result, volatile storage elements are often used. For example, a volatile storage element such as a flip-flop circuit includes a master latch and a slave latch, where each of the master and slave latches includes a pair of cross-coupled inverters. Such types of volatile storage elements are subject to a phenomenon known as a Soft Error Upset or Single Event Upset (SEU) event.

An SEU event is an error induced by an incident particle on an integrated circuit. The incident particle generally generates electron-hole pairs as the particle traverses through a semiconductor material of the integrated circuit. The electrons (or holes) may get collected at a circuit node, resulting in a voltage perturbation at that node. Such a transient then may propagate through the circuit connected to the affected node and may introduce operational errors. If the affected node belongs to a latch design, the data stored in the latch may get altered, resulting in an SEU event. For example, the electron-hole pairs create a conduction path that can cause a charged node in the storage element to discharge and the state of the storage element to flip. If a logic "1" was stored at the node, an SEU event could cause the logic "1" to change to a logic "0." SEU events in an integrated circuit can significantly corrupt the data stored in a storage element and can have serious repercussions on system performance. In various system applications such as remote installations of telecommunications equipment, it is commonly desirable to have integrated circuits that demonstrate good immunity to such SEU events.

In this regard, a number of techniques, including spatial as well as temporal redundancy, have been proposed to improve performance of integrated circuits to resist SEU events. Temporal redundancy generally uses multiple sampling of a given node during one clock cycle to ensure data integrity. Such techniques require extra design efforts and usually exact heavy performance penalties. Spatial redundancy techniques, such as Dual Interlocked Storage Cell (DICE) designs, increase the reliability of a system at varying levels of performance penalties. For example, a DICE latch has been implemented (e.g., as a storage element) in various integrated circuits. Due to its dual interlocked structure, the DICE latch is generally considered less vulnerable to SEU events than Static Random Access Memory (SRAM) latches and D-type flipflop latches.

Although the existing DICE latches are generally less vulnerable to SEU events due to their dual interlocked structure (e.g., two interlocked paths), only one of these two interlocked paths has an output buffer. As a result, if that path is attached (e.g., by neutron energy and one of the nodes along the attached path goes to a negative voltage potential or above power voltage level for a short time), then both of the dual interlocked paths may be flipped and an output voltage potential of the DICE latch will be at the wrong logic level. Because of the lack of a corresponding buffer on the other path (and thus less capacitance), it may cause (nodes along) this path more vulnerable to SEU events and can eventually affect the path that has the output buffer. Accordingly, the exiting DICE latches are not entirely satisfactory in certain aspects.

The present disclosure provides various embodiments of a DICE latch circuit that includes two or more sub-latches, each of which is coupled to a global output terminal of the DICE latch circuit through a respective output buffer. In some embodiments, each of the sub-latches may correspond to a respective one of a number of interlocked paths. Further, a first of the sub-latches may include a first DICE component and a second DICE component, a second of the sub-latches may include a third DICE component and a fourth DICE component, a third one of the sub-latches may include a fifth DICE component and a sixth DICE component, and so on. The DICE components can be coupled to one another as a loop. Each of the DICE components can include a p-type transistor and an n-type transistor coupled to each other, so as to have a first input terminal, a second input terminal, a first output terminal, and a second output terminal. Each of the DICE components can be connected to the first and second input terminals of a next DICE component with its first and second input terminals. With each of the sub-latches coupled to the global output terminal of the DICE latch circuit through the respective output buffer, the different interlocked paths may become more balanced, which can significantly improve (reduce) Failure In Time (FIT) rate of the DICE latch circuit. Further, the global output terminal of the disclosed DICE latch circuit can be more stronger in terms of resisting SEU events.

FIG. 1 illustrates a block diagram of a DICE latch circuit 100, in accordance with various embodiments. In general, the DICE latch circuit 100 is a type of a latch circuit, and further includes redundant storage nodes to restore the original logical state when an SEU event is introduced in a node of the DICE latch circuit 100. It should be understood that the DICE latch circuit 100 is simplified for illustrative purposes, and thus, the DICE latch circuit 100 can include any of various other components, while remaining within the scope of the present disclosure.

The DICE latch circuit 100 can be included in, coupled to, integrated into, or otherwise used in any of various logic circuits, as a latch to store data and hold a value of the data until it is updated by a new input signal. As a non-limiting example, the DICE latch circuit 100 may be configured to store addresses of defective memory cells of a memory device. The DICE latch circuit 100 may be assigned to one or more redundant rows or one or more redundant columns of the memory device. Generally, the addresses of the defective memory cells are permanently stored in a fuse bank, for example, a non-volatile storage space. When the memory device is initialized for operation, the DICE latch circuit 100 may be reset and the addresses of the defective memory cells, provided by the fuse bank, are loaded into the DICE latch circuit 100. In this way, each of the addresses are assigned to a redundant memory location, such as a redundant row or redundant column. As a result, when an address of a known defective memory cell is accessed during operation, the redundant memory assigned to the matching address of the defective memory cells is accessed instead of the original, defective memory.

As shown, the DICE latch circuit 100 includes a (e.g., global) input terminal 110, a first sub-latch 120, a second sub-latch 130, a first buffer 140, a second buffer 150, and a (e.g., global) output terminal 160. The DICE latch circuit 100 can receive an input data "D" at the input terminal 110 and provide an output signal "Q" at the output terminal 160. A (e.g., logical) value of the input data D may be held as the output signal Q until the value is updated. In some embodiments, the first sub-latch 120 and the second sub-latch 130 may correspond to a first interlocked path and a second interlocked path, respectively, which will be discussed in further detail below. Such first and second interlocked paths (first and second sub-latches 120 and 130) can share the same input data D. Further, the first and second interlocked paths (first and second sub-latches 120 and 130) can provide the same output signal Q through respective buffers 140 and 150. Stated another way, the first buffer 140 can be operatively interposed between the first sub-latch 120 and the output terminal 160, and the second buffer can be operatively interposed between the second sub-latch 130 and the output terminal 160.

The first and second buffers 140 and 150 may each be a digital buffer. Such a digital buffer can amplify its input signal in order to drive a high current load. In addition, the digital buffer can provide isolation between its input and output circuits where its output is connected to some high-power load. In the following discussion, the buffer connected between the corresponding sub-latch and the global output terminal is implemented as an inverter, i.e., a NOT gate. However, it should be appreciated that the buffer can be implemented as any of various other digital components such as, for example, a non-inversion logic gate, while remaining within the scope of the present disclosure.

In some embodiments, each of the first and second sub-latches 120 and 130 may include a number of DICE components coupled to each other, and all the DICE components of the first and second sub-latches 120 and 130 may be further cross-coupled to one another. For example in FIG. 1, the first sub-latch 120 includes first and second DICE components 122 and 124, and the second sub-latch 130 includes third and fourth DICE components 132 and 134. In some embodiments, the DICE components 122, 124, 132, and 134 may each have a first input terminal (or node), a second input terminal (or node), a first output terminal (or node), and a second output terminal (or node), and these DICE components 122, 124, 132, and 134 may be coupled to one another in a loop configuration. In some embodiments, interconnection between adjacent ones of the DICE components 122, 124, 132, and 134 are formed via a plural number of nodes.

Figure 2:
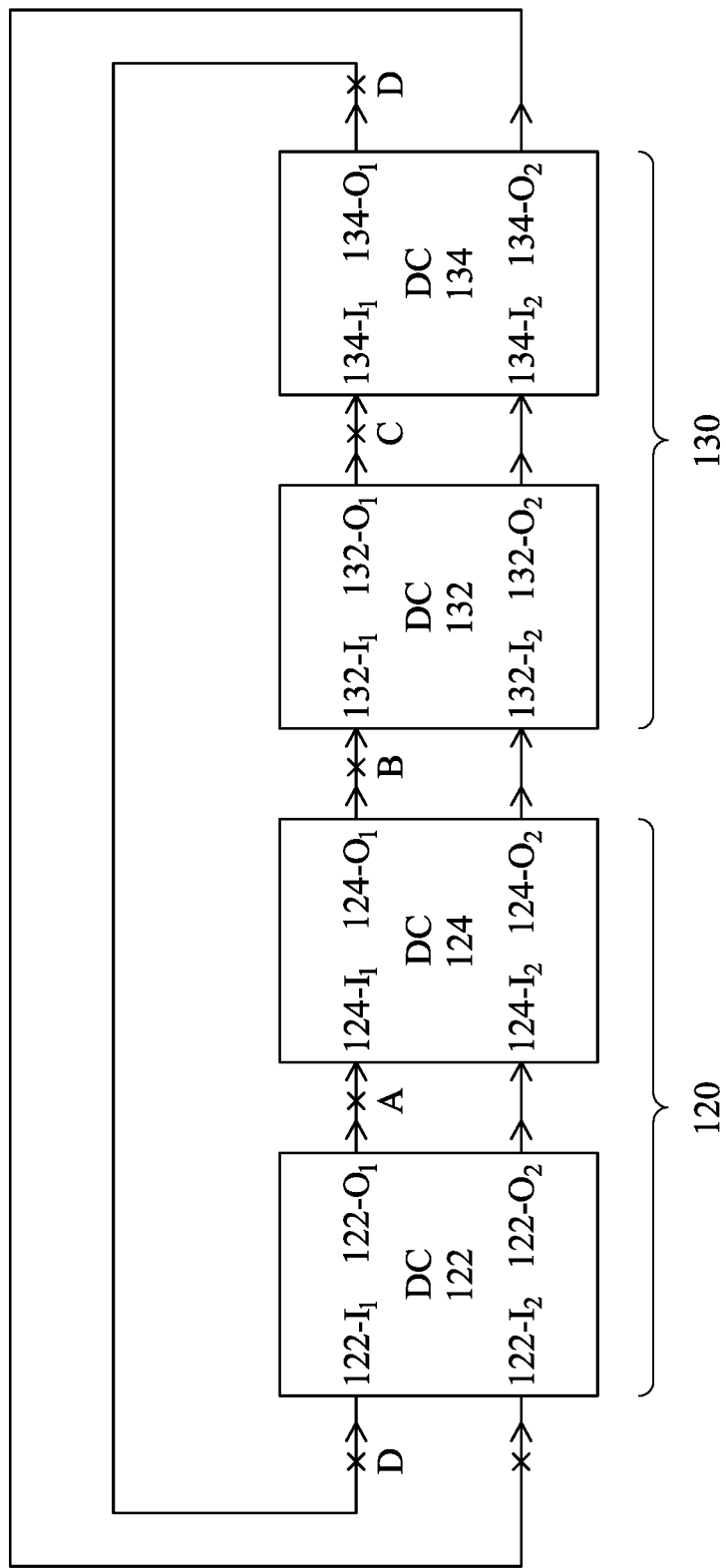
FIG. 2 illustrates a block diagram of a loop formed by DICE components of the DICE latch circuit shown in FIG. 1, in accordance with some embodiments.

FIG. 2 illustrates a block diagram in which the DICE components 122, 124, 132, and 134 are formed as a loop, in accordance with various embodiments. The adjacent DICE components 122 and 124 may operatively form the first sub-latch 120 (FIG. 1), and the adjacent DICE components 132 and 134 may operatively form the second sub-latch 130 (FIG. 1). In some embodiments, the DICE component 122 can have input terminals $122\_I_1$ and $122\_I_2$ and output terminals $122\_O_1$ and $122\_O_2$; the DICE component 124 can have input terminals $124\_I_1$ and $124\_I_2$ and output terminals $124\_O_1$ and $124\_O_2$; the DICE component 132 can have input terminals $132\_I_1$ and $132\_I_2$ and output terminals $132\_O_1$ and $132\_O_2$; and the DICE component 134 can have input terminals $134\_I_1$ and $134\_I_2$ and output terminals $134\_O_1$ and $134\_O_2$.

Specifically, to form a loop, the output terminal $122\_O_1$ is connected to the input terminal $124\_I_1$; the output terminal $122\_O_2$ is connected to the input terminal $124\_I_2$; the output terminal $124\_O_1$ is connected to the input terminal $132\_I_1$; the output terminal $124\_O_2$ is connected to the input terminal $132\_I_2$; the output terminal $132\_O_1$ is connected to the input terminal $134\_I_1$; the output terminal $132\_O_2$ is connected to the input terminal $134\_I_2$; the output terminal $134\_O_1$ is connected to the input terminal $122\_I_1$; and the output terminal $134\_O_2$ is connected to the input terminal $122\_I_2$.

Depending on the implementation of the DICE component (which will be discussed below with respect to FIGS. 3-5), one or more input/output terminals may be connected to a common node. For example, in one aspect of the present disclosure, the first output terminal (e.g., $122\_O_1$) and the second input terminal (e.g., $122\_I_2$) of the DICE component (e.g., 122) may be connected to each other at a common node inside the DICE component. Other DICE components may be configured in similar fashion. Accordingly, four nodes A, B, C, and D can be formed in the loop of the DICE components 122, 124, 132, and 134, as shown in the example of FIG. 2.

With such a configuration, logic states (or values) of the nodes A to D may be alternately arranged. For example, the logic states of the nodes A to D may be equal to 0, 1, 0, and 1, respectively, when the DICE components 122, 124, 132, and 134 are in an isolated state, a latch state, an isolated state, and a latch state, respectively. In another example, the logic states of the nodes A to D may be equal to 1, 0, 1, and 0, respectively, when the DICE components 122, 124, 132, and 134 are in a latch state, an isolated state, a latch state, and an isolated state, respectively. The term "isolated state" may refer to all transistors included in a DICE component being turned off, and the term "latch state" may refer to all transistors included in a DICE component being turned on. And thus, the isolated state and latch state are sometimes referred to as "OFF" state and "ON" state, respectively.

In this way, any adjacent ones of the DICE components can have different logic states, so that the DICE latch circuit as a whole can stably retain one logical state. Stated another way, the DICE component in the latch state and the DICE component in the isolated state are arranged in an alternate manner, so that a logic between nodes is continued without contradiction, and thereby data can be less vulnerable to SEU events. For example, the DICE components 122, 124, 132, and 134 may be originally configured in the ON state, OFF state, OFF state, and OFF state, respectively. Even if an SEU event (e.g., incidence of energetic particles) may cause the DICE component 124 to erroneously switched from the OFF state to the ON state for a moment, proper data is input to the DICE component 124 from the DICE component 122 and the DICE component 132 on both sides of the DICE component 124, so that immediately after the SEU event disappears, the DICE component 124 is returned to normal operation and set to the OFF state.

Figure 3:
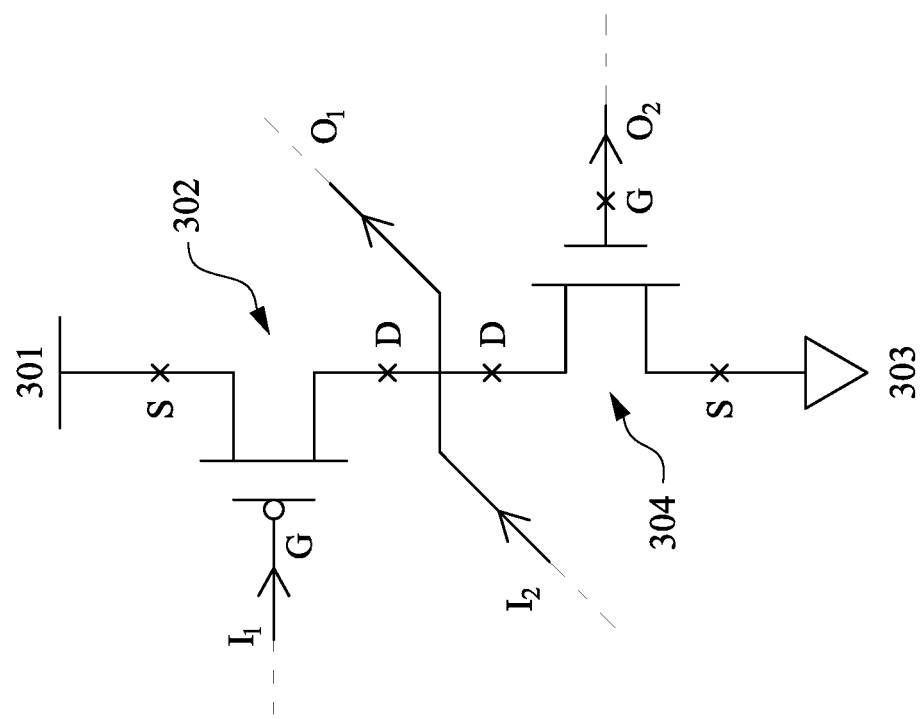
FIG. 3 illustrates an example circuit diagram of a DICE component, in accordance with some embodiments.

FIG. 3 illustrates an example circuit diagram of the DICE component discussed above (e.g., 122, 124, 132, 134), in accordance with some embodiments. It should be understood that the circuit diagram of FIG. 3 is merely provided as a non-limiting illustrative example, and each of the DICE components of the disclosed DICE latch circuit 100 can be implemented as any of various other circuit configurations such as, for example, the circuit diagrams shown in FIGS. 4 and 5, respectively.

Referring first to FIG. 3, the DICE component may include a first transistor 302 and a second transistor 304 coupled between a first supply voltage 301 (e.g., VDD) and a second supply voltage 303 (e.g., ground). In some embodiments, the first transistor 302 may be a p-type Metal-Oxide-Semiconductor Field-Effect-Transistor (MOSFET) and the second transistor 304 may be an n-type MOSFET. Specifically, the first transistor 302 has its source connected to the first supply voltage, its drain connected to the second transistor 304, and its gate configured as a first input terminal ($I_1$) of the DICE component; and the second transistor 304 has its source connected to the second supply voltage, its drain connected to the first transistor 302, and its gate configured as a second output ($O_2$) of the DICE component. The common node connecting the respective drains of the first and second transistors 302 and 304 may be configured as a second input terminal ($I_2$) of the DICE component and a first output terminal ($O_1$) of the DICE component.

Figure 4:
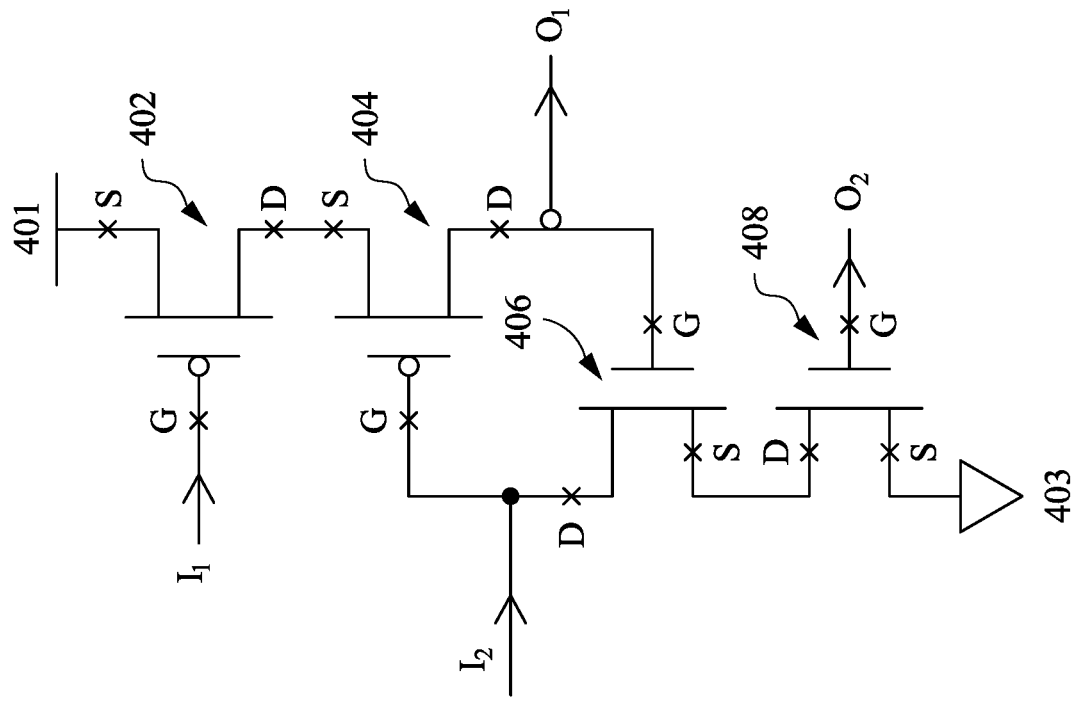
FIG. 4 illustrates another example circuit diagram of a DICE component, in accordance with some embodiments.

Referring next to FIG. 4, the DICE component may include a first transistor 402, a second transistor 404, a third transistor 406, and a fourth transistor 408 coupled between a first supply voltage 401 (e.g., VDD) and a second supply voltage 403 (e.g., ground). In some embodiments, the first and second transistors 402 and 404 may each be a p-type MOSFET and the third and fourth transistors 406 and 408 may each be an n-type MOSFET. Specifically, the first transistor 402 has its source connected to the first supply voltage, its drain connected to a source of the second transistor 404, and its gate configured as a first input terminal ($I_1$) of the DICE component; the second transistor 404 has its source connected to the drain of the first transistor 402, its drain connected to a gate of the third transistor 406, and its gate connected to a drain of the third transistor 406; the third transistor 406 has its drain connected to the second transistor 404, its source connected to a drain of the fourth transistor 408, and its gate connected to the second transistor 404; and the fourth transistor 408 has its drain connected to the third transistor 406, its gate configured as a second output ($O_2$) of the DICE component, and its source connected to the second supply voltage. The first common node connecting the gate of the second transistors 404 and the drain of the third transistor 406 may be configured as a second input terminal ($I_2$) of the DICE component, and the second common node connecting the gate of the third transistors 406 and the drain of the second transistor 404 may be configured as a first output terminal ($O_1$) of the DICE component.

Figure 5:
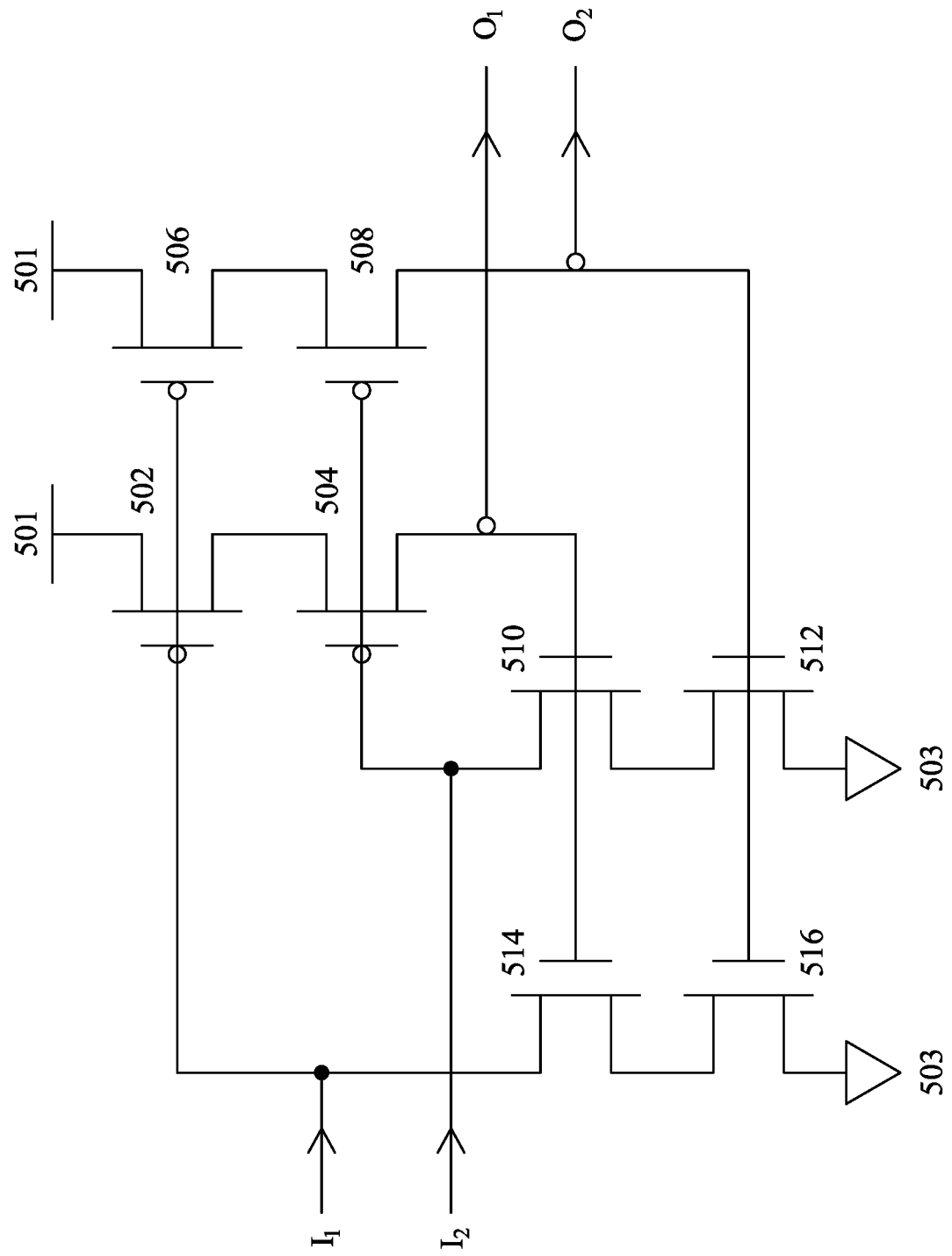
FIG. 5 illustrates yet another example circuit diagram of a DICE component, in accordance with some embodiments.

Referring then to FIG. 5, the DICE component may include a first transistor 502, a second transistor 504, a third transistor 506, a fourth transistor 508, a fifth transistor 510, a sixth transistor 512, a seventh transistor 514, an eighth transistor 516 coupled between a first supply voltage 501 (e.g., VDD) and a second supply voltage 503 (e.g., ground).

In some embodiments, the first to fourth transistors, 502 to 508, may each be a p-type MOSFET, and the fifth to eighth transistors, 510 to 516, may each be an n-type MOSFET. The circuit configuration of FIG. 5 is substantially similar to the circuit configuration of FIG. 4, except that FIG. 5 further includes transistors 506 and 508 and transistors 514 and 516. As such, a first input terminal ($I_1$) of the DICE component may be configured at a first common node connecting respective gates of the transistors 502 and 506 and a drain of the transistor 514; a second input terminal ($I_2$) of the DICE component may be configured at a second common node connecting respective gates of the transistors 504 and 508 and a drain of the transistor 510; a first output terminal (01) of the DICE component may be configured at a third common node connecting a drain of the transistor 504 and respective gates of the transistors 510 and 514; and a second output terminal (02) of the DICE component may be configured at a fourth common node connecting a drain of the transistor 508 and respective gates of the transistors 512 and 516.

Figure 6:
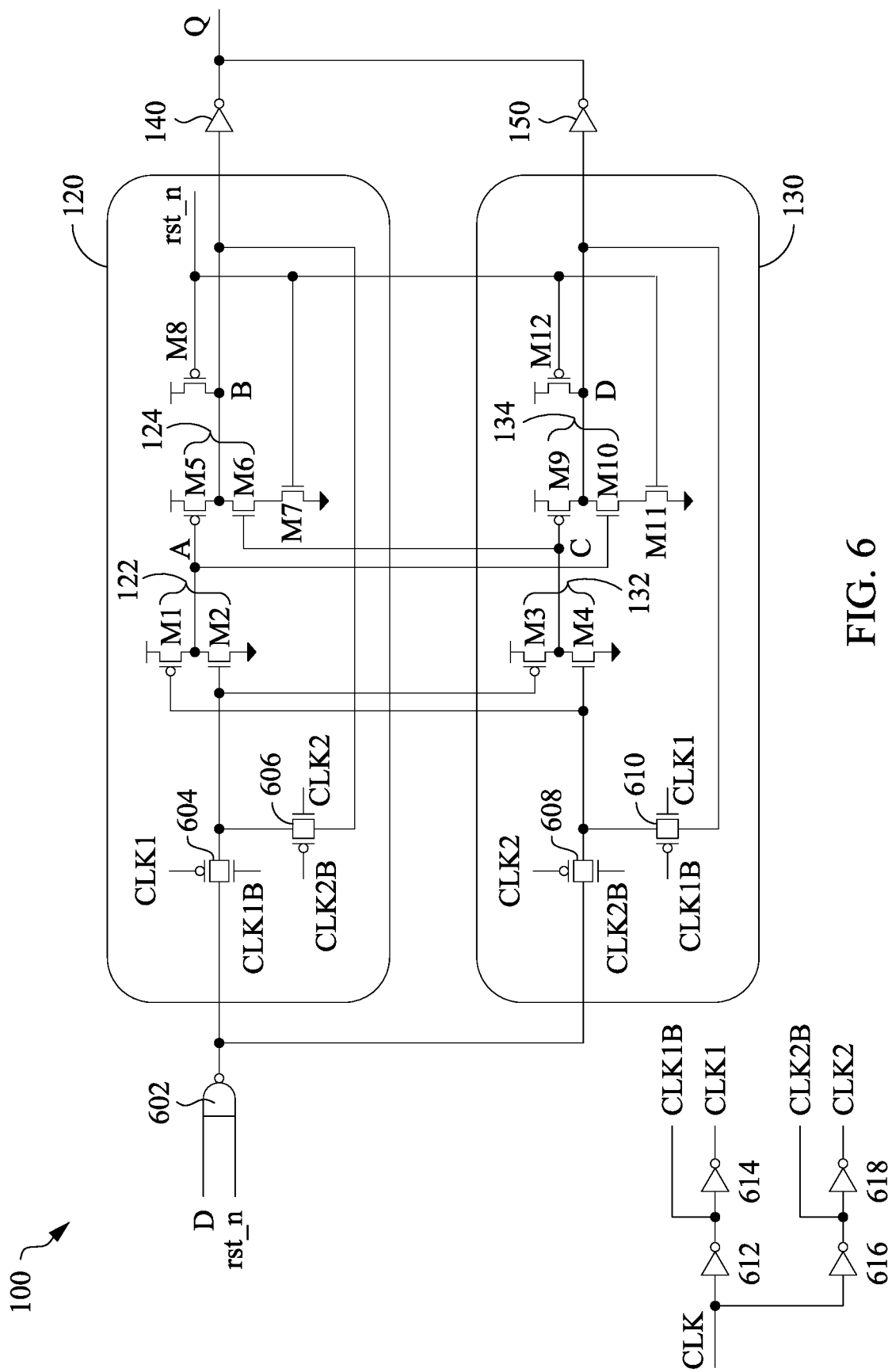
FIG. 6 illustrates an example circuit diagram of the DICE latch circuit shown in FIG. 1, in accordance with some embodiments.

FIG. 6 illustrates an example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure.

As shown in FIG. 6, the DICE latch circuit 100 includes a NAND gate 602, transmission gates 604, 606, 608, and 610, and transistors M1, M2, M3, M4, M5, M6, M7, M8, M9, M10, M11, and M12. In the illustrative embodiment of FIG. 6, the first sub-latch 120 may include the transmission gates 604-606 and the transistors M1-M2 and M5-M8; and the second sub-latch 130 may include the transmission gates 608-610 and the transistors M3-M4 and M9-M12. Further, the transistors M1 and M2 can form the DICE element 122 (FIG. 2); the transistors M5 and M6 can form the DICE element 124 (FIG. 2); the transistors M3 and M4 can form the DICE element 132 (FIG. 2); and the transistors M9 and M10 can form the DICE element 134 (FIG. 2). Accordingly, the nodes A, B, C, and D illustrated in FIG. 2 are present at a first common node connecting the transistors M1 and M2, a second common node connecting the transistors M5 and M6, a third common node connecting the transistors M3 and M4, and a fourth common node connecting the transistors M9 and M10, respectively, as shown in FIG. 6. In some embodiments, the node B (e.g., an output terminal of the first sub-latch 120) is coupled to the global output terminal providing the signal Q through the buffer 140, and the node D (e.g., an output terminal of the second sub-latch 130) is coupled to the global output terminal providing the signal Q through the buffer 150.

The DICE latch circuit 100 can receive the input data D through one input of the NAND gate 602, while the other input of the NAND gate 602 is configured to receive a reset signal "rst_n." The reset signal rst_n may be provided at logic 1 when to latch the input data D as the output signal Q, and at logic 0 when to reset the whole DICE latch circuit 100. In an example where the input data D is provided at logic 1, the transmission gates 604 and 608 may pass a signal with logic 0 to the n-type transistors M2 and M4, respectively, which in turn activate the p-type transistors M1 and M3. The transmission gates 606 and 610 may also pass a signal with logic 0 to the buffers 140 and 150, respectively. With the transistors M1 and M3 turned on, the transistors M1 and M3 can conduct VDD to the nodes A and C, and, thus, the nodes A and C may each present logic 1, which in turn activate the n-type transistors M6 and M10. Accordingly, the transistors M6 and M10 can conduct ground to the nodes B and D (through the transistors M7 and M11 being turned on by the reset signal rst_n provided at logic 1), so that the nodes B and D may each present logic 0. Through the respective buffers (e.g., inverters) 140 and 150, a value of the output signal Q is provided as logic 1. When the input date D is provide at logic 0, operation of the DICE latch circuit 100 is similar, and thus, the discussion is not repeated.

In some embodiments, the transmission gates 604 and 610 may be controlled by a first clock signal CLK1 (and its logically inverse signal CLK1B), and the transmission gates 606 and 608 may be controlled by a second clock signal CLK2 (and its logically inverse signal CLK2B). The clock signals, CLK1, CLK1B, CLK2, CLK2B, can be generated based on a global clock signal CLK through a number of inverters 612, 614, 616, and 618. The clock signals CLK1 and CLK2 may be in phase with respect to each other, and the clock signals CLK1B and CLK2B may also be in phase with respect to each other.

Figure 7:
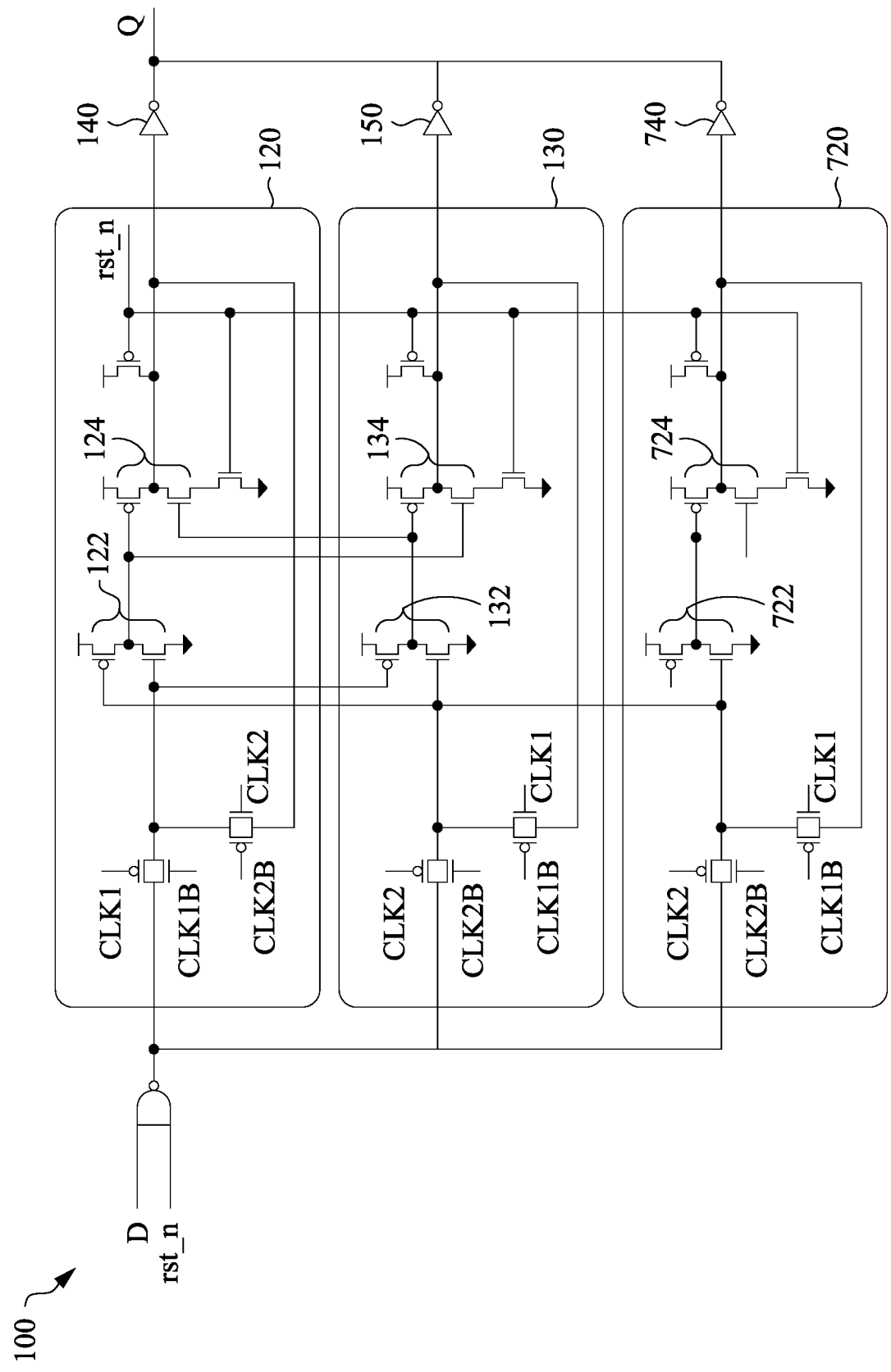
FIG. 7 illustrates another example circuit diagram of the DICE latch circuit shown in FIG. 1, in accordance with some embodiments.

FIG. 7 illustrates another example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure.

The circuit configuration shown in FIG. 7 is substantially similar to the circuit configuration shown in FIG. 6, except for an additional sub-latch 720 and an additional buffer 740. The sub-latch 720 and buffer 740 are substantially similar to the sub-latch 120/130 and the buffer 140/150, respectively. Thus, the description is focused on the difference. For example, DICE components 722 and 724 of the sub-latch 720 may form another interlocked path for the DICE latch circuit 100. As such, the DICE components 122, 124, 132, 134, 722, and 724 may form (e.g., in this order) a longer loop. With an additional sub-latch (together with a corresponding buffer), reliability of the DICE latch circuit 100 may be further increased.

Figure 8:
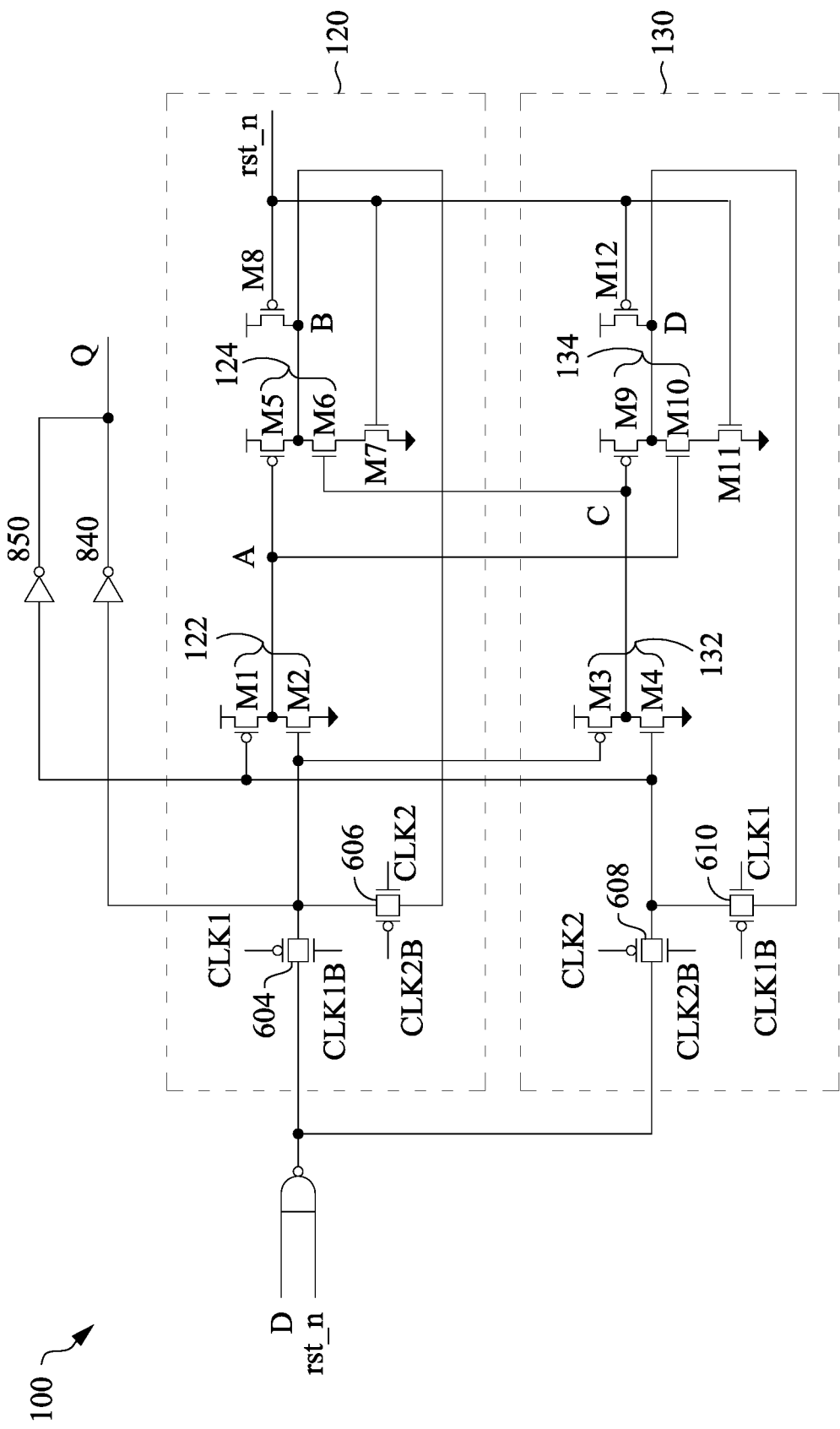
FIG. 8 illustrates yet another example circuit diagram of the DICE latch circuit shown in FIG. 1, in accordance with some embodiments.

FIG. 8 illustrates yet another example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure.

The circuit configuration shown in FIG. 8 is substantially similar to the circuit configuration shown in FIG. 6, except that, in FIG. 8, buffers 840 and 850 are connected to different nodes. For example, the buffer 840 has an input connected to a node between the transmission gates 604 and 606, rather than a node after the transmission gate 606 (FIG. 6). Similarly, the buffer 850 has an input connected to a node between the transmission gates 608 and 610, rather than a node after the transmission gate 610 (FIG. 6). Such a configuration may increase operation speed of the DICE latch circuit 100, because of a less number of gates from the global input terminal (receiving the input data D) to the global output terminal (providing the signal Q).

In some embodiments, the buffer 840 may be indirectly coupled to the node B (e.g., through the transmission gate 606) but directly coupled to the second input of the DICE component 122 (e.g., the gate of the transistor M2). Similarly, the buffer 850 may be indirectly coupled to the node D (e.g., through the transmission gate 610) but directly coupled to the second input of the DICE component 132 (e.g., the gate of the transistor M4).

Figure 9:
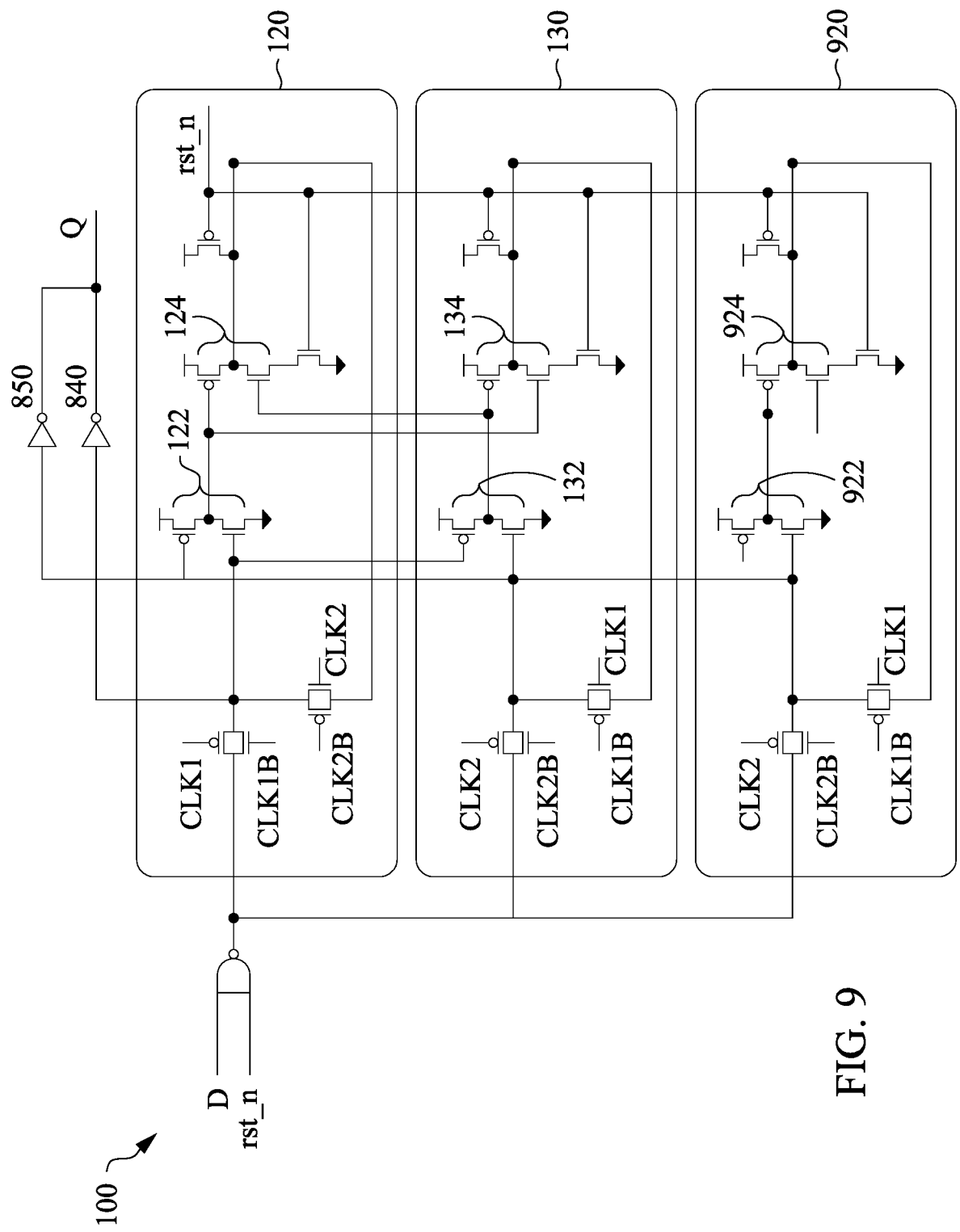
FIG. 9 illustrates yet another example circuit diagram of the DICE latch circuit shown in FIG. 1, in accordance with some embodiments.

FIG. 9 illustrates yet another example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure.

The circuit configuration shown in FIG. 9 is substantially similar to the circuit configuration shown in FIG. 8, except for an additional sub-latch 920. The sub-latch 920 is substantially similar to the sub-latch 120/130. Thus, the description is focused on the difference. For example, in addition to be directly connected to the gate of the transistor M2 of the sub-latch 130 (FIG. 8), the buffer 850 may be directly connected to a gate of the n-type transistor of DICE component 922 of the sub-latch 920. With an additional sub-latch (together with a corresponding buffer), reliability of the DICE latch circuit 100 may be further increased. In some other embodiments, the DICE latch circuit 100 can include an additional buffer (not shown) connecting the gate of the n-type transistor of DICE component 922 to the global output terminal (providing the signal Q).

Figure 10:
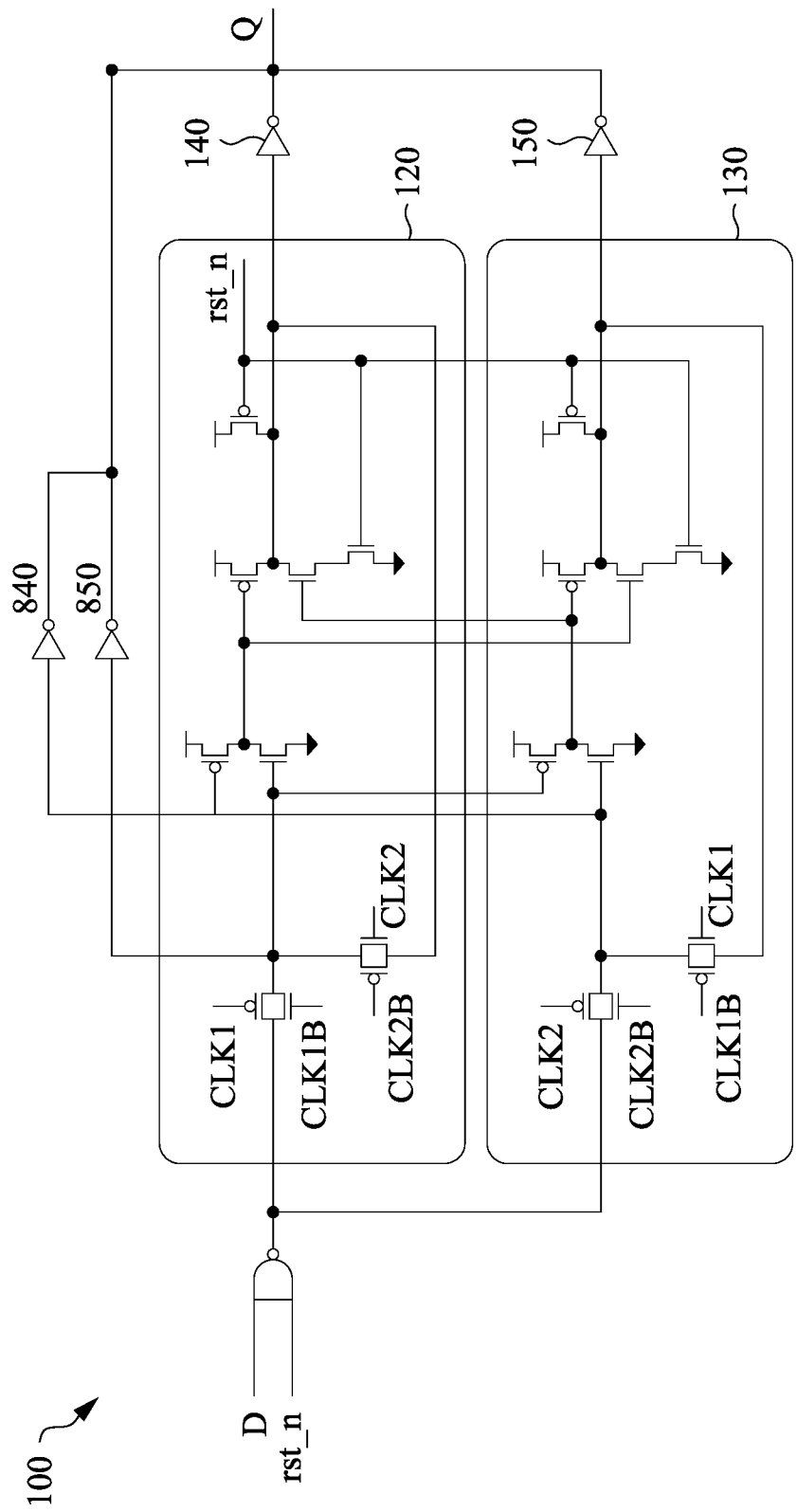
FIG. 10 illustrates yet another example circuit diagram of the DICE latch circuit shown in FIG. 1, in accordance with some embodiments.

FIG. 10 illustrates yet another example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure. The circuit configuration shown in FIG. 10 is substantially similar to a combination of the circuit configurations shown in FIGS. 6 and 8, respectively. Thus, the description is not repeated.

Figure 11:
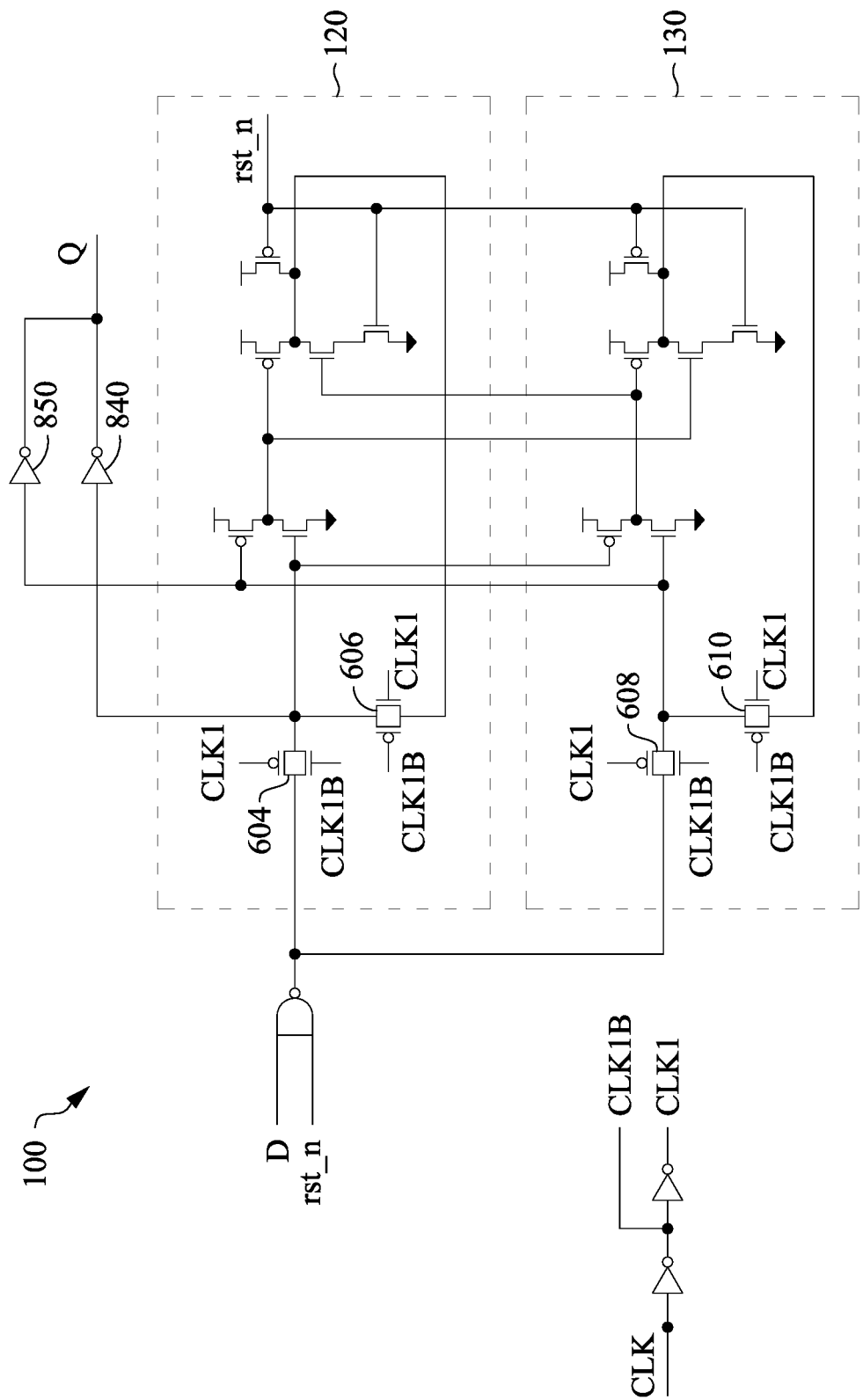
FIG. 11 illustrates yet another example circuit diagram of the DICE latch circuit shown in FIG. 1, in accordance with some embodiments.

FIG. 11 illustrates yet another example circuit diagram of the DICE latch circuit 100 (FIG. 1) including the first sub-latch 120 and the second sub-latch 130, in which the DICE components 122, 124, 132, and 134 operatively forming the sub-latches 120 and 130 are each implemented as the circuit configuration shown in the example of FIG. 3, in accordance with some embodiments. It should be appreciated that DICE components 122, 124, 132, and 134 may each be implemented as any of various other circuit configurations (e.g., FIG. 4 or 5), while remaining within the scope of the present disclosure. The circuit configuration shown in FIG. 11 is substantially similar to the circuit configuration shown in FIG. 8, except that all four transmission gates 604 to 610 share a same clock signal CLK1 (and its logically inverse signal CLK1B).

Figure 12:
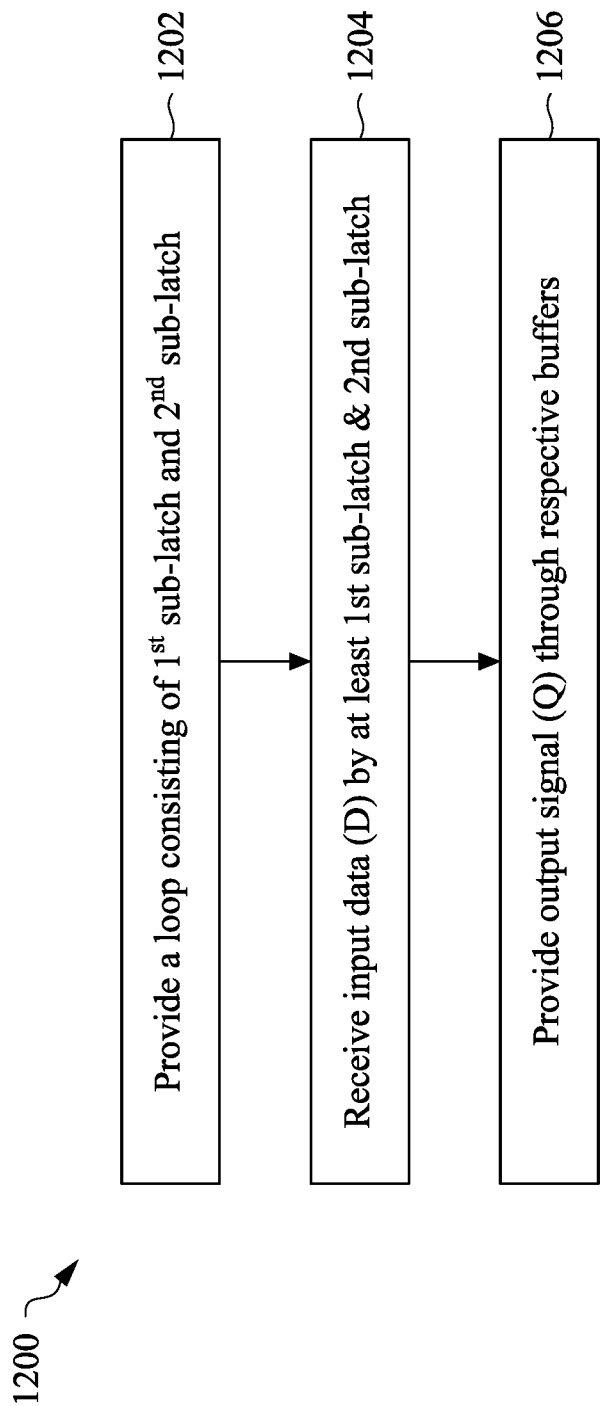
FIG. 12 illustrates a flow chart of an example method for operating a DICE latch circuit, in accordance with some embodiments.

FIG. 12 illustrates a flow chart of an example method 1200 for latching an input data D as an output signal Q through a plural number of interlocked paths, in accordance with some embodiments of the present disclosure. The method 1200 may be performed to operate the DICE latch circuit 100 (FIG. 1), and thus, in the following discussion of operations of the methods 1200, the reference numerals used in FIGS. 1-11 may be reused. It is noted that the method 1200 is merely an example and is not intended to limit the present disclosure. Accordingly, it is understood that additional operations may be provided before, during, and after the method 1200 of FIG. 12, and that some other operations may only be briefly described herein.

The method 1200 starts with operation 1202 in which a loop, including a first sub-latch and a second sub-latch, is provided, in accordance with some embodiments. The first sub-latch and the second sub-latch may correspond to a first interlocked path and a second interlocked path, respectively. Further, each of the first sub-latch and the second sub-latch may include a plural number of DICE components, and all the DICE components of the different sub-latches may be alternately arranged with (e.g., coupled to) each other to form the loop.

Using the circuit configuration of DICE latch circuit 100 shown in FIG. 6 as a representative example, the first sub-latch (e.g., 120) includes DICE components 122 and 124, and the second sub-latch (e.g., 130) includes DICE components 132 and 134. Based on the connection shown in FIG. 6, the DICE components 122, 124, 132, and 134 can form a loop, as shown in FIG. 2, in which the DICE components 122 and 124 (the first sub-latch 120) may form a first interlocked path, and the DICE components 132 and 134 (the second sub-latch 130) may form a second interlocked path.

The method 1200 proceeds to operation 1204 in which an input data D is received by the first sub-latch and the second sub-latch, in accordance with some embodiments. Continuing with the above example, the first sub-latch 120 and second sub-latch 130 can receive the same input data D.

The method 1200 continues to operation 1206 in which the first sub-latch and the second sub-latch provide a same intermediate signal through respective buffers as an output signal Q, in accordance with some embodiments. Prior to latching the input data D as the output signal Q, each of the first and second sub-latches may provide an intermediate signal to a corresponding output buffer. With each of the first and second sub-latches coupled to a respective output buffer, immunity of the disclosed DICE latch circuit can be further improved.

Continuing with the above example (FIG. 6), the first sub-latch 120 and second sub-latch 130 can provide a same intermediate signal through their respective buffers 140 and 150 as the output signal Q. Specifically, the DICE component 122 of the first sub-latch 120 can latch a logic value of the input data D (e.g., logic 0) at the node A, and the DICE component 124 of the first sub-latch 120 can latch an inverse of the logic value (e.g., logic 1) at the node B; and, simultaneously, the DICE component 132 of the second sub-latch 130 can latch a logic value of the input data D (e.g., logic 0) at the node C, and the DICE component 134 of the second sub-latch 130 can latch an inverse of the logic value (e.g., logic 1) at the node D. The intermediate signal latched at the nodes B and D can then be provided as the output signal Q through the respective output buffers 140 and 150.

In one aspect of the present disclosure, a circuit is disclosed. The circuit includes a first Dual Interlocked Storage Cell (DICE) component, a second DICE component, a third DICE component, and a fourth DICE component operatively coupled to one another as a loop. The first and second DICE components form a first sub-latch configured to receive an input signal, the third and fourth DICE components form a second sub-latch configured to receive the same input signal, the first sub-latch is configured to provide, at a first node of the first sub-latch, an intermediate signal based on the input signal, and the second sub-latch is configured to provide, at a second node of the second sub-latch, the same intermediate signal based on the input signal. The circuit includes a first inverter configured to logically invert the intermediate signal and provide, at a third node, an output signal. The circuit includes a second inverter configured to logically invert the intermediate signal and provide, at the third node, the output signal.

In another aspect of the present disclosure, a circuit is disclosed. The circuit includes a global input terminal configured to receive an input signal; a global output terminal configured to provide an output signal; a first sub-latch coupled between the global input terminal and the global output terminal, and comprising a first Dual Interlocked Storage Cell (DICE) circuit and a second DICE component; a second sub-latch coupled between the global input terminal and the global output terminal, and comprising a third DICE component and a fourth DICE component; a first buffer coupled between the first sub-latch and the global output terminal; and a second buffer coupled between the second sub-latch and the global output terminal. The first and third DICE components are configured to be in a first operation state, while the second and fourth DICE components are configured to be in a second, different operation state.

In yet another aspect of the present disclosure, a method is disclosed. The method includes providing a loop including at least a first Dual Interlocked Storage Cell (DICE) component, a second DICE component, a third DICE component, and a fourth DICE component, wherein the first and second DICE components form a first sub-latch, the third and fourth DICE components form a second sub-latch. The method includes receiving, by the first sub-latch and the second sub-latch, an input signal. The method includes providing, by the first sub-latch, an intermediate signal based on the input signal at a first node. The method includes providing, by the second sub-latch, the intermediate signal based on the input signal at a second node. The method includes logically inverting, by a first inverter and a second inverter, the intermediate signal. The method includes providing, at a third node, an output signal.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first Dual Interlocked Storage Cell (DICE) component, a second DICE component, a third DICE component, and a fourth DICE component operatively coupled to one another as a loop, wherein the first and second DICE components form a first sub-latch configured to receive an input signal, the third and fourth DICE components form a second sub-latch configured to receive the same input signal, the first sub-latch is configured to provide, at a first node of the first sub-latch, an intermediate signal based on the input signal, and the second sub-latch is configured to provide, at a second node of the second sub-latch, the same intermediate signal based on the input signal;
   a first inverter configured to logically invert the intermediate signal and provide, at a third node, an output signal; and
   a second inverter configured to logically invert the intermediate signal and provide, at the third node, the output signal.

2. The circuit of claim 1, wherein the first to fourth DICE components are identical to one another.

3. The circuit of claim 1, wherein each of the first to fourth DICE components includes a p-type transistor and an n-type transistor.

4. The circuit of claim 3, wherein each of the first to fourth DICE components includes a first input terminal, a second input terminal, a first output terminal, and a second output terminal.

5. The circuit of claim 4,
   wherein the first input terminal of the first DICE component is a gate of its p-type transistor, the second input terminal of the first DICE component is a common node connecting its p-type transistor and n-type transistor, the first output terminal of the first DICE component is the common node connecting its p-type transistor and n-type transistor, and the second output terminal of the first DICE component is a gate of its n-type transistor;
   wherein the first input terminal of the second DICE component is a gate of its p-type transistor, the second input terminal of the second DICE component is a common node connecting its p-type transistor and n-type transistor, the first output terminal of the second DICE component is the common node connecting its p-type transistor and n-type transistor, and the second output terminal of the second DICE component is a gate of its n-type transistor;
   wherein the first input terminal of the third DICE component is a gate of its p-type transistor, the second input terminal of the third DICE component is a common node connecting its p-type transistor and n-type transistor, the first output terminal of the third DICE component is the common node connecting its p-type transistor and n-type transistor, and the second output terminal of the third DICE component is a gate of its n-type transistor; and
   wherein the first input terminal of the fourth DICE component is a gate of its p-type transistor, the second input terminal of the fourth DICE component is a common node connecting its p-type transistor and n-type transistor, the first output terminal of the fourth DICE component is the common node connecting its p-type transistor and n-type transistor, and the second output terminal of the fourth DICE component is a gate of its n-type transistor.

6. The circuit of claim 5, wherein the common node connecting the p-type transistor to the n-type transistor of the second DICE component is the first node of the first sub-latch.

7. The circuit of claim 6, wherein the common node connecting the p-type transistor to the n-type transistor of the fourth DICE component is the second node of the second sub-latch.

8. The circuit of claim 5, wherein the first input terminal of the first DICE component is the first node of the first sub-latch.

9. The circuit of claim 8, wherein the first input terminal of the third DICE component is the second node of the second sub-latch.

10. The circuit of claim 1, wherein the first and second sub-latches are each configured to receive the input signal based on a first clock signal and a second clock signal.

11. The circuit of claim 1, wherein the first and second sub-latches are each configured to receive the input signal based on a single clock signal.

12. The circuit of claim 1, further comprising:
a fifth DICE component and a sixth DICE component, further coupled to the first to fourth DICE components as the loop, wherein the fifth and sixth DICE components form a third sub-latch configured to receive the same input signal, and the third sub-latch is configured to provide, at a fourth node, the same intermediate signal based on the input signal;
a third inverter configured to logically invert the intermediate signal and provide, at the third node, the output signal.

13. A circuit, comprising:
a global input terminal configured to receive an input signal;
a global output terminal configured to provide an output signal;
a first sub-latch coupled between the global input terminal and the global output terminal, and comprising a first Dual Interlocked Storage Cell (DICE) component and a second DICE component;
a second sub-latch coupled between the global input terminal and the global output terminal, and comprising a third DICE component and a fourth DICE component;
a first buffer coupled between the first sub-latch and the global output terminal; and
a second buffer coupled between the second sub-latch and the global output terminal;
wherein the first and third DICE components are configured to be in a first operation state, while the second and fourth DICE components are configured to be in a second, different operation state.

14. The circuit of claim 13, wherein each of the first to fourth DICE components includes a p-type transistor and an n-type transistor.

15. The circuit of claim 14, wherein each of the first to fourth DICE components includes a first input terminal, a second input terminal, a first output terminal, and a second output terminal.

16. The circuit of claim 15,
wherein the first input terminal of the first DICE component is a gate of its p-type transistor, the second input terminal of the first DICE component is a common node connecting its p-type transistor and n-type transistor, the first output terminal of the first DICE component is the common node connecting its p-type transistor and n-type transistor, and the second output terminal of the first DICE component is a gate of its n-type transistor;
wherein the first input terminal of the second DICE component is a gate of its p-type transistor, the second input terminal of the second DICE component is a common node connecting its p-type transistor and n-type transistor, the first output terminal of the second DICE component is the common node connecting its p-type transistor and n-type transistor, and the second output terminal of the second DICE component is a gate of its n-type transistor;
wherein the first input terminal of the third DICE component is a gate of its p-type transistor, the second input terminal of the third DICE component is a common node connecting its p-type transistor and n-type transistor, the first output terminal of the third DICE component is the common node connecting its p-type transistor and n-type transistor, and the second output terminal of the third DICE component is a gate of its n-type transistor; and
wherein the first input terminal of the fourth DICE component is a gate of its p-type transistor, the second input terminal of the fourth DICE component is a common node connecting its p-type transistor and n-type transistor, the first output terminal of the fourth DICE component is the common node connecting its p-type transistor and n-type transistor, and the second output terminal of the fourth DICE component is a gate of its n-type transistor.

17. The circuit of claim 16, wherein the common node connecting the p-type transistor to the n-type transistor of the second DICE component is an output node of the first sub-latch connected to the first buffer, and the common node connecting the p-type transistor to the n-type transistor of the fourth DICE component is an output node of the second sub-latch connected to the second buffer.

18. The circuit of claim 16, wherein the gate of the n-type transistor of the first DICE component is an output node of the first sub-latch connected to the first buffer, and the gate of the n-type transistor of the third DICE component is an output node of the second sub-latch connected to the second buffer.

19. A method, comprising:
providing a loop including at least a first Dual Interlocked Storage Cell (DICE) component, a second DICE component, a third DICE component, and a fourth DICE component, wherein the first and second DICE components form a first sub-latch, the third and fourth DICE components form a second sub-latch;
receiving, by the first sub-latch and the second sub-latch, an input signal;
providing, by the first sub-latch, an intermediate signal based on the input signal at a first node;
providing, by the second sub-latch, the intermediate signal based on the input signal at a second node;
logically inverting, by a first inverter and a second inverter, the intermediate signal;
providing, at a third node, an output signal.

20. The method of claim 19, wherein the first to fourth DICE components are identical to one another, and wherein each of the first to fourth DICE components includes a p-type transistor and an n-type transistor.

\* \* \* \* \*